(12) United States Patent
Cheng

(10) Patent No.: US 8,298,034 B2
(45) Date of Patent: Oct. 30, 2012

(54) PATTERNING A THICK FILM PASTE IN SURFACE FEATURES

(75) Inventor: Lap-Tak Andrew Cheng, Newark, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 99 days.

(21) Appl. No.: 12/809,687

(22) PCT Filed: Dec. 19, 2008

(86) PCT No.: PCT/US2008/087673
§ 371 (c)(1),
(2), (4) Date: Aug. 2, 2010

(87) PCT Pub. No.: WO2009/086100
PCT Pub. Date: Jul. 9, 2009

(65) Prior Publication Data
US 2010/0314989 A1   Dec. 16, 2010

Related U.S. Application Data

(60) Provisional application No. 61/016,028, filed on Dec. 21, 2007.

(51) Int. Cl.
*H01J 9/12* (2006.01)

(52) U.S. Cl. .................. 445/50; 445/49; 445/51

(58) Field of Classification Search .......... 313/309–311, 313/495–497; 445/49–51
See application file for complete search history.

(56) References Cited

U.S. PATENT DOCUMENTS

| | | | |
|---|---|---|---|
| 5,930,890 A | 8/1999 | Chou et al. | |
| 2002/0074932 A1 | 6/2002 | Bouchard et al. | |
| 2004/0173818 A1 | 9/2004 | Cheng | |
| 2005/0032254 A1 | 2/2005 | Cheng | |
| 2005/0116612 A1* | 6/2005 | Oh | 313/497 |
| 2005/0136787 A1 | 6/2005 | Lee et al. | |
| 2005/0269928 A1* | 12/2005 | Kim et al. | 313/311 |

FOREIGN PATENT DOCUMENTS

WO  01/99146 A2  12/2001

OTHER PUBLICATIONS

International Search Report for International Patent Application No. PCT/US2008/087673 Dated May 6, 2009.

* cited by examiner

*Primary Examiner* — Bumsuk Won

(57) ABSTRACT

This invention relates to a method for the fabrication of electrical and electronic devices using a photoresist deposited in pre-existing through holes in a device structure and a thick film paste, and to the devices made by such method. The method allows thick film paste deposits in the corners of the holes. This invention also relates to devices made with thick film pastes that are patterned using a diffusion layer made from residual photoresist deposits in a hole.

10 Claims, 3 Drawing Sheets

PATTERNING A THICK FILM PASTE IN SURFACE FEATURES

This application claims priority under 35 U.S.C. §119(e) from, and claims the benefit of, U.S. Provisional Application No. 61/016,028, filed Dec. 21, 2007, which is by this reference incorporated in its entirety as a part hereof for all purposes.

TECHNICAL FIELD

This invention relates to a method for the fabrication of electrical and electronic devices using a photoresist material and a thick film paste, and to the devices made thereby.

BACKGROUND

Patterning of deposits of thick film pastes is a matter of concern in the electronics industry. A particular example of this is the patterning of deposits of pastes containing carbon nanotubes used as field emitters in field emission displays.

U.S. Ser. No. 04/173,818 describes a binder diffusion transfer method in which there is diffusion of a previously deposited photoresist into a subsequently deposited thick film paste. U.S. Ser. No. 05/136,787 describes a binder diffusion transfer method to deposit thick film emitter paste in a hole on a field emission cathode.

A need nevertheless remains for an improved method to deposit a thick-film paste in a through hole in an electronic device.

SUMMARY

The inventions disclosed herein include methods for the fabrication of a stack of layers, methods for the fabrication of products into which the stack of layers can be installed, the use of such methods, and the products obtained and obtainable by such methods.

Features of certain of the methods and apparatus of this invention are described herein in the context of one or more specific embodiments that combine various such features together. The scope of the invention is not, however, limited by the description of only certain features within any specific embodiment, and the invention also includes (1) a subcombination of fewer than all of the features of any described embodiment, which subcombination may be characterized by the absence of the features omitted to form the subcombination; (2) each of the features, individually, included within the combination of any described embodiment; and (3) other combinations of features formed by grouping only selected features taken from two or more described embodiments, optionally together with other features as disclosed elsewhere herein. Some of the specific embodiments of the processes hereof are as follows:

In one embodiment, this invention provides a method of depositing a thick-film paste in a through hole having a side wall, by (a) providing a stack of layers that comprises a base layer and an external layer disposed on the surface of the base layer, or on the surface of one or more layers intermediate between the external layer and the base layer, wherein the external layer comprises a plurality of through holes that pass through the external layer and any intermediate layers to expose the surface of the base layer; (b) coating the external layer with photoresist material to provide a layer of photoresist material across the external layer and in the through holes; (c) solidifying the photoresist material; (d) flood irradiating the photoresist material to convert to a soluble form (i) the solidified photoresist material on the external layer, and (ii) the solidified photoresist material down to a selected depth of the layer of photoresist material in the through holes; (e) developing the photoresist material to remove the solidified photoresist material (i) from the external layer, and (ii) from within the through holes down to the selected depth of the layer, wherein removal of photoresist material from within the through holes exposes the surface of the base layer; (f) coating the external layer with a thick-film paste comprising a solvent to provide a layer of thick-film paste across the external layer and in the through holes; (g) solubilizing the photoresist material with the solvent in the locations in the through holes at which the thick-film paste contacts the photoresist material; and (h) developing the thick-film paste to remove it from all locations except those in which the thick-film paste has contacted the photoresist material.

In a further embodiment, this invention provides an electron emitting apparatus that includes (a) a substrate; (b) a first conductive layer disposed on the substrate; (c) a dielectric layer disposed on the first conductive layer; (d) a second conductive layer disposed on the dielectric layer; (e) a plurality of through holes, each having a side wall(s), that pass through the second conductive layer and the dielectric layer to expose the surface of the first conductive layer; and (f) an electron emitting material disposed at the junction of the side wall(s) of a through hole and the surface of the first conductive layer.

In another embodiment, this invention provides an electronic device that includes a multi-layer stack of layers, and a patterned deposit on exposed portion(s) of a surface of a layer thereof of a mixture of a photoresist material and a thick film paste material.

This invention further discloses the above-described methods as further comprising the additional step of firing the substrate patterned with the thick film paste. This invention additionally describes the above-described method as further comprising the step of activating the thick film paste.

This invention relates to a method for the fabrication of electrical and electronic devices using a photoresist material and a thick film paste deposited in through holes, which may be shaped as a cylindrical shaft or as an ellipse or a rectangle or as a regularly- or irregularly-shaped polygon, on a device substrate. In particular, the method allows for the accurate deposition of thick film paste at the junctions where the hole side wall(s) intersect the hole bottoms. The method allows for such paste deposits without the use of an external photo-mask and its alignment. This invention also relates to devices made with thick film pastes that are patterned using a diffusion layer made from residual photoresist deposits in a hole.

This invention describes a method in which a thick film paste, such as an emitter paste containing carbon nanotubes, can be deposited at the side wall and bottom junction of a hole using the binder diffusion transfer method but without using an external photo-mask and any mask alignment procedure. This invention teaches coating an electronic device substrate that contains surface features of holes, with a photoresist. The photoresist is flood irradiated, without the use of an external photo mask, under conditions such that photoresist is partially converted to the soluble form. The photoresist is then developed removing the converted material. It is found that in holes, photoresist deposits remain at the junctions where the side wall(s) of the holes intersect the bottoms of the holes. Thick film paste is subsequently deposited into the holes and the remaining photoresist is allowed to diffuse into the thick film paste. The thick film paste is subsequently developed, leaving a deposit of thick film paste into which the photoresist has diffused. This paste deposit is located at the junction where the side wall(s) and hole bottom meet, but is essentially absent from the center of the hole bottom.

BRIEF DESCRIPTION OF THE DRAWINGS

Various features and/or embodiments of this invention are illustrated in drawings as described below. These features and/or embodiments are representative only, and the selection of these features and/or embodiments for inclusion in the drawings should not be interpreted as an indication that subject matter not included in the drawings is not suitable for practicing the invention, or that subject matter not included in the drawings is excluded from the scope of the appended claims and equivalents thereof.

DETAILED DESCRIPTION

Figure 1A:
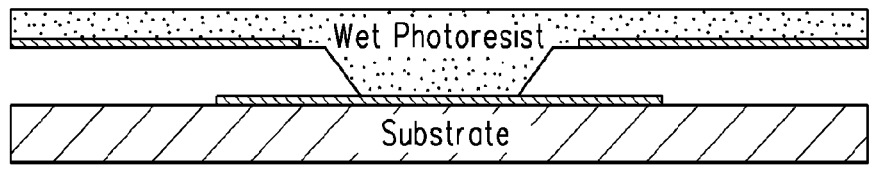
FIG. 1 shows a schematic of the method of this invention.
Figure 1B:
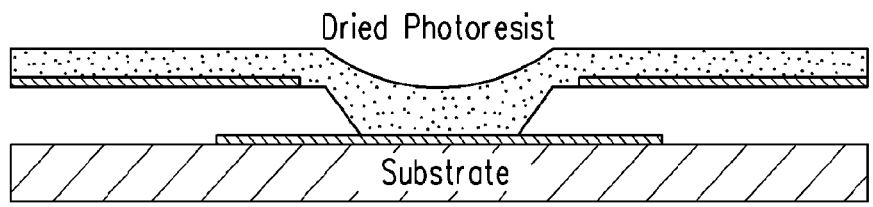
Figure 1C:
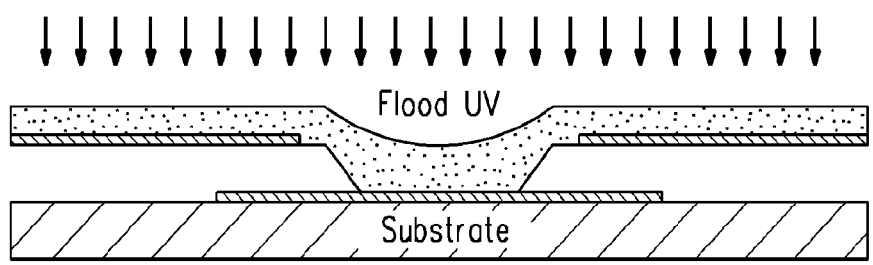
Figure 1D:
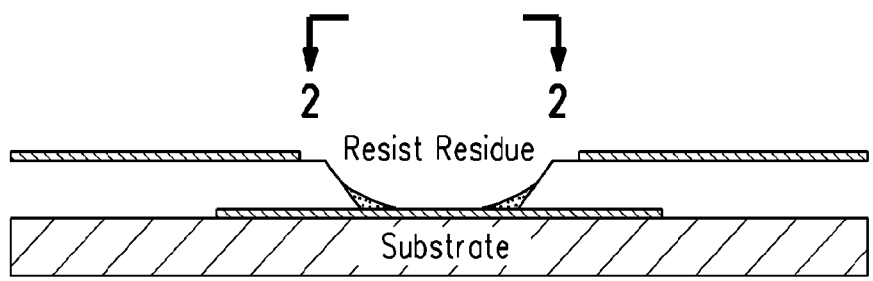
Figure 1E:
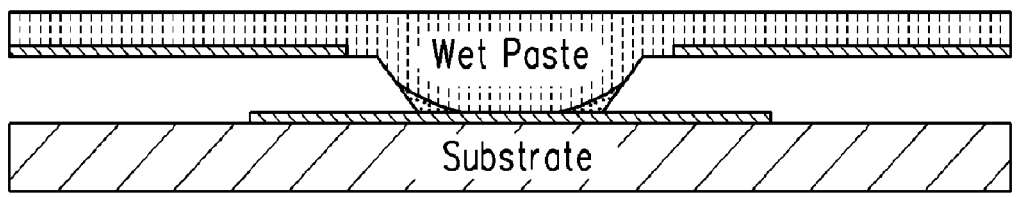
Figure 1F:
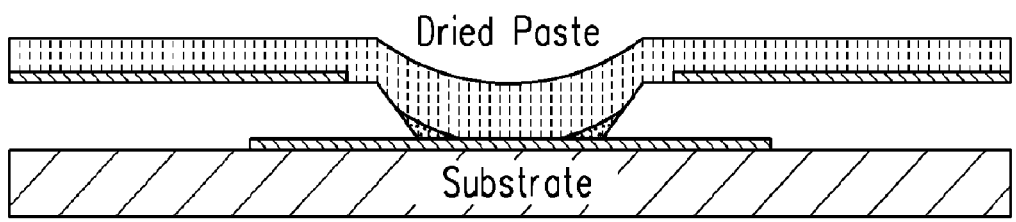
Figure 1G:
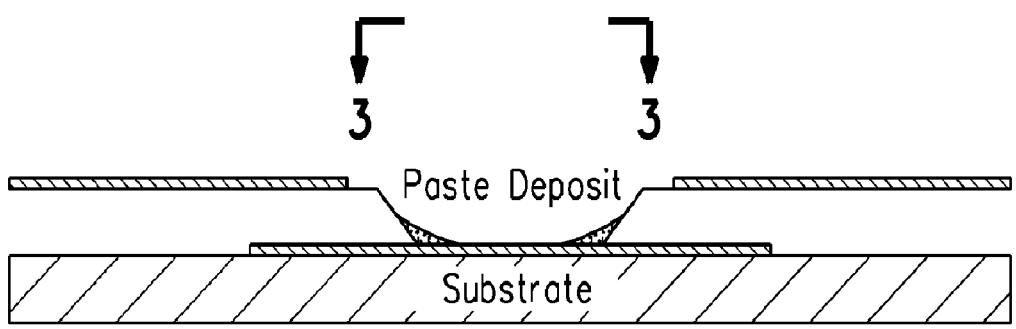

One embodiment of this invention provides a method to deposit thick-film paste in a through hole in an electronic device. The through hole typically exists in a multi-layer stack of layers in the electronic device, and the derivation of the term "through hole" is a direct reflection of the fact that the through hole is simply a hole that passes through all of the layers in the stack except a layer (the "deposition layer") on which the thick-film paste is deposited, and any other layer(s) on which the deposition layer resides or that support the deposition layer. The various layers in the stack may be conductive or nonconductive as desired.

When the stack is viewed in terms of a cross sectional, vertical elevation thereof, such as shown in FIG. 1, each of the various layers is visible. A through hole is visible in such a view, however, only because the layers are shown cut away to the location of the through hole where it passes from the top of the stack down to the deposition layer. When the stack is viewed from the top, such as shown in the top image portion of FIGS. 2 and 3, the top opening of each through hole is visible as well as the bottom of the through hole at the deposition layer where photoresist material and thick-film paste are deposited, as described below.

The shape of the through hole, when viewed from the top of the stack, may be circular as the term "hole" would typically denote. The through hole is not limited to a circular shape, however, and may have other shapes such as the shape of an ellipse, or a polygon such as a rectangle (e.g. a square), or may simply have a generally round shape that is not perfectly circular. A through hole that is elongated in one dimension, such as that which is formed in the shape of an ellipse or a non-square rectangle, is sometimes referred to as a trench. Regardless of shape, each through hole has one or more side walls.

A multi-layer stack in which a through hole, or a plurality of through holes, may exist may contain, for example, a substrate, which would form the bottom layer of the stack in the context of a view of a cross sectional, vertical elevation of the stack; and would also have other layers disposed on, residing on or built up on top of the substrate. There is no minimum or maximum number of the other layers that are disposed on, reside on or are built up on top of the substrate. There is typically, however, at least a base layer (the deposition layer) disposed on or supported by the substrate, and an external layer on top of the stack. There may be one or more intermediate layers residing in the stack between the base layer and the external layer. In such case, there will be one or more through holes in the external layer passing therethrough to the base layer, which is the deposition layer. Where a plurality of layers are disposed on the base layer, and residing between the base layer and the external layer, the through hole(s) will exist in and pass through each such layer. The through hole(s) will thus provide an opening in the external layer at the top of the stack, and will pass from the external layer through each of the other internal, intermediate layers as may be present, until reaching the base layer where deposition of material occurs.

Photoresist material is applied as a layer on the external layer. The photoresist material is also deposited in each through hole in the external layer, and thus also down the depth of the through hole and onto the portion of the base layer that is exposed at the bottom of the through hole. A stack with multiple through holes typically, but not always, has through holes that are of the same dimension and depth, and the layer of photoresist material is preferably uniform over the entire external layer. The layer of photoresist material can be formed by various means including spin coating, rod coating, slot die coating, stencil printing, inkjet printing and photopatterning.

It is preferred to use a photoresist material herein that readily permits a high degree of control in coating thickness, clean development of exposed area, and developer solubility vs exposure dose. Photoresist materials may contain polymers, dissolution inhibitors, monomers, photo-initiators, photo-acid generators, and/or solvent. The photoresist material is selected to be soluble in the solvent from which a later-applied thick-film paste is formulated.

The photoresist material may for example be of the novalac-type positive photoresist material, or the chemically amplified type positive photoresist material (e.g. the APEX resist from IBM). Examples of suitable photoresist materials include phenolic resins, DNQ/Novalac resists, acrylic polymers, polymers containing pendent t-butyl groups, polystyrene and ethyl cellulose.

Examples of photoresist materials suitable for use for the type of fine feature patterning occurring herein include the DNQ/Novalac and the chemically amplified resists. Feature size of below 1 micron is routinely achieved. In a DNQ/Novalac type resist, the DNQ, a solubility inhibitor, is decomposed upon exposure to UV radiation rendering the exposed region soluble in a weakly basic developer. In a chemically-amplified resist, a photoacid generator is included in the resist formulation. The acid generated upon irradiation and bake can remove a tertiary butyl group from the polymer of the resist. With the butyl group removed, the polymer then becomes soluble in an alkaline or basic developer. The unexposed region of the photo-resist is highly resistant to dissolution in alkaline or basic developer. Additionally, these resists are typically highly soluble in most organic solvents such as ketones, alcohols, esters, ethers, long chain acetates and aromatics. These solvents, including without limitation, texanol and β-terpineol are also often used to formulate many thick film pastes.

A useful type of photoresist material to select for this purpose is a novalac or chemically amplified type of resist, since those work in the positive mode, and the exposed area of the resist is dissolved and removed by application of the developer rinse. The developer in such case may, for example, be a mildly basic aqueous solution (e.g. 1% sodium hydroxide).

After deposition, drying and soft baking of the photoresist material, the thickness of the layer of photoresist material deposited in the through holes is greater than the thickness of the layer of photoresist material deposited on the surface of the external layer in the stack. In addition, the deposit of photoresist material is found to be thickest at the junctions where the side wall(s) of each through hole intersect the base layer, and thinner on the surface of the external layer and in the portion of the base layer in and around the center of the hole.

The layer of photoresist material, including the deposit thereof located in each through hole, is then flood irradiated, i.e. it is irradiated without the use of a photomask, such that any portion of the photoresist material receiving a sufficient dose of radiation is converted to soluble form. The duration of irradiation is selected such that the thinner portions of the layer of photoresist material, such as that located on the surface of the external layer, are fully irradiated while the photoresist material in each through hole is only partially irradiated because of the greater thickness of material at the bottom of the through hole. That is, because of the varying thickness of the layer of photoresist material, the amount of radiation corresponding to the selected duration irradiates the layer to differing depths because thinner areas become fully irradiated within the time of the selected duration while thicker areas become irradiated to only a partial depth. From this flood irradiation, the photoresist material in and around the center of each through hole (i.e. the material in the included area of the surface of the base layer interior to the wall/layer junction) is converted to soluble form because it is thin enough to be fully irradiated within the time of the selected duration, but the photoresist material located at the wall/layer junction area itself is not rendered soluble because the material is thicker at that location.

Figure 2:
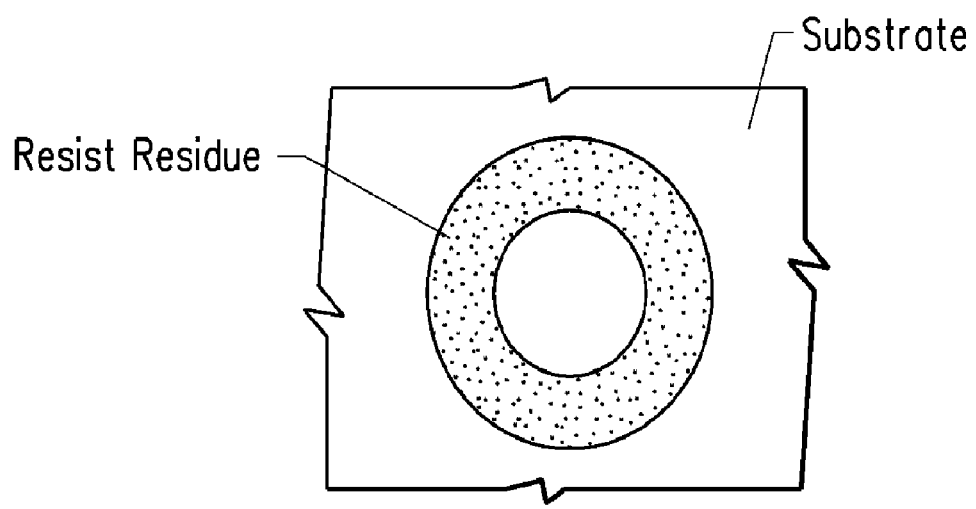
FIG. 2 shows a ring of photoresist at the bottom of a through hole.

After irradiation, the photoresist material is contacted with a developing solution. The thinner portions of the irradiated photoresist material, which received sufficient radiation to become soluble, are dissolved and removed. Removing photoresist material from within a through hole down to the selected depth removes photoresist material from an interior portion of a circumscribed area of the surface of the base layer. Photoresist material in the through holes at and adjacent to the junction of the through hole side wall(s) and the base layer remain as insoluble, however, because the amount of radiation they received was not sufficient to render them soluble. That is, as previously noted, the degree of exposure of the photoresist material to radiation is selected to render soluble only the material in locations where the deposit is thin enough to be fully irradiated within the time of selected duration, while the material in other locations is not rendered soluble because it was deposited with a greater thickness and is thus not solubilized. The photoresist material remaining after washing with the developer, such as at and adjacent to the junction of the through hole side wall(s) and the base layer is shown in FIG. 2; it may then be hard baked for the purpose of controlling its diffusion in subsequent steps.

The developing solution used herein may, for example, be a weakly basic aqueous solution of sodium carbonate, KOH, NaOH or tetra-methyl ammonium hydroxide (TMAH).

At this point in the method, a layer of thick-film paste is deposited over the entire external layer, which also includes depositing thick-film paste in locations where it makes contact with the remaining deposits of photoresist material at the bottom of each through hole. Techniques such as screen printing or slot die coating may be used to apply and deposit the thick-film paste. After deposition, the resulting layer of thick-film paste film is dried, which operation may be conducted, for example, at a temperature in the range of about 50° C. to about 150° C. for a time in the range of about 1 to about 30 minutes. During this drying step, the solvent in the thick-film paste solubilizes and/or induces dissolution of the remaining deposit of photoresist material, which is followed by diffusion mixing of the photoresist material into the layer of thick-film paste.

The extent of diffusion of photoresist material into the layer of thick-film paste during the drying step will vary according to factors such as the extent to which the photoresist material was hard baked prior to application of the thick-film paste, the selection of the solvent system for the thick-film paste, and the temperature and duration of the drying step. Since the remaining deposit of photoresist material received insufficient radiation to become soluble in the developer, the portion of the layer of thick-film paste into which photoresist material diffuses correspondingly becomes insoluble to the developer. When a developer is then applied to the surface of the stack, thick-film paste is thereby removed in all areas except those diffusion regions where diffusion of photoresist material has occurred. That is, the portions of the layer of thick-film paste into which the photoresist material has diffused are rendered insoluble by the presence of the photoresist material therein, and those portions, which are predominantly at and adjacent to the junction of the through hole side walls and base layer, remain intact after application of the developer, which does however remove all other portions of the layer of thick-film paste.

Figure 3:
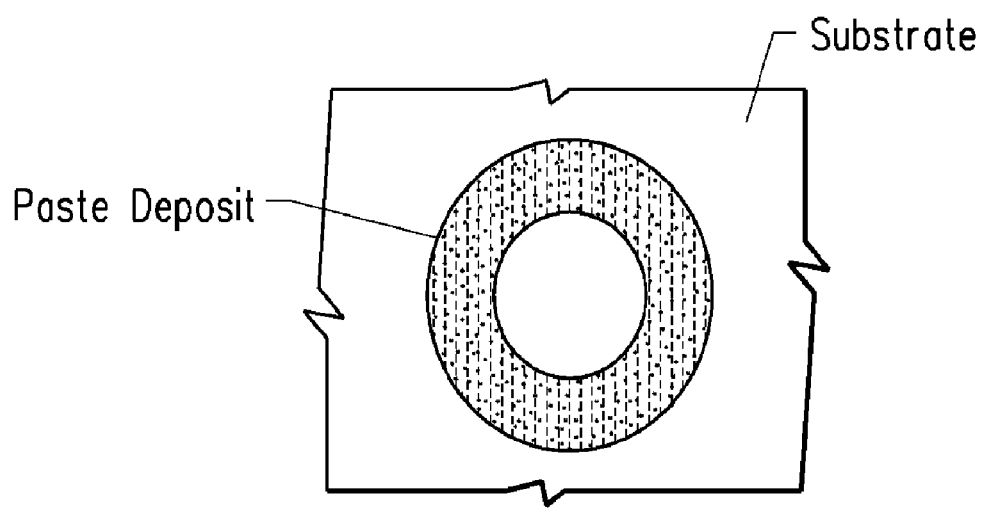
FIG. 3 shows a ring of emitter paste at the bottom of a through hole.

The final deposit of material, i.e. that which remains as insoluble after the application of developer, is typically about 30% to about 50% larger than the corresponding residual deposit of photoresist material that is solubilized by the solvent in the thick-film paste. This expansion in the size of the final insoluble deposit is shown in FIG. 3, and results from the diffusion of solubilized photoresist material into the layer of thick-film paste. The portion of the layer of thick-film paste into which diffusion occurs becomes the portion of the final insoluble deposit that increases the size thereof, and the extent of the increase in size of the final insoluble deposit (i.e. the extent to which diffusion of photoresist material converts thick-film paste to an insoluble material) will vary according to the same factors mentioned above, such as the extent to which the photoresist material was hard baked prior to application of the thick-film paste, the selection of the solvent system for the thick-film paste, and the temperature and duration of the drying step.

The thick film paste may contain glass frit, inorganic powders, metallic powders, an alkaline or water soluble binder or binder polymer, photoactive monomers, initiators and/or an organic solvent. Special thick film pastes for use as electron field emitters in displays may additionally contain an acicular emitting substance such as carbon nanotubes.

The thick film paste is formulated with a solvent system which will dissolve a paste binder polymer and the photoresist. The paste binder polymer is additionally soluble in a development solvent or solution in which photoresist has poor solubility. Suitable paste binder polymers include acrylic polymers with carboxyl groups, acrylic polymers with acidic groups, polyvinylalcohol, co-polymers of polyvinylalcohol and polyvinylacetate, and polyhydroylstyrene. Examples of solvents suitable for use in the formulation of a thick-film paste include organic solvents such as ketones, alcohols, esters, ethers and aromatics, including but not limited to texanol and β-terpineol.

For thick film pastes formulated with alkaline soluble binder polymers, a dry paste film can be readily washed off by spraying with an alkaline developer or soaking in the developer while agitated by ultrasonic action. A suitable method of removal is with a spray of an aqueous alkaline developer (e.g. 0.5% sodium carbonate) or by ultrasonic treatment.

By using a novalac-type or a chemically amplified type photo-resist together with an alkaline soluble thick film paste, fine feature patterning of the thick film paste can be achieved by the binder diffusion transfer patterning in surface features in the methods hereof.

The fabrication methods hereof are illustrated by the sequence of views of the side elevation of the configuration of a stack of layers, as shown in FIG. 1. In Frame 1, photoresist material is deposited on a base layer, which resides on a substrate. Photoresist material is also deposited on an external layer and on a portion of an intermediate layer, where the intermediate layer is disposed on the base layer and substrate. A through hole exists in the intermediate layer through which the deposit of photoresist material is given access to the base layer. In one embodiment of the situation represented by Frame 1, the base layer may, for example, be a cathode layer, the intermediate layer may be a dielectric layer, and the external layer may be a gate electrode layer.

In Frame 1(a), the wet photoresist material is dried by a soft bake.

In Frame 2, the photoresist material is flood irradiated, which means that it is exposed to UV radiation over the entire area that is coated with the material but in the absence of any type of photomask to shield certain areas of the material from exposure while the remaining areas do receive exposure. The extent of the exposure of the photoresist material to the irradiation converts the photoresist material to a soluble form down to a selected depth of the layer thereof corresponding to the extent of exposure.

In Frame 3, the photoresist material is developed in a developer to remove the portion thereof that has been rendered soluble by irradiation. In particular, the photoresist material is developed to remove the solidified material (i) from the surface of the external layer and the intermediate layer, and (ii) from within the through hole down to the depth at which the radiation caused insolubility of the layer of photoresist material. Removal of photoresist material from within the through hole exposes the surface of the base layer. Thus, after application of the developer, residual photoresist material is found at the junction of the through hole side walls where they intersect the surface of the base layer, i.e. at the junction of the side walls of the through hole and the bottom of the through hole.

In Frame 4, a thick-film paste is then deposited on the top surface of the stack, i.e. on the surface of the external layer and intermediate layer, in the through hole, and, most importantly, on the residue of photoresist material that is located at the junction of the side walls of the through hole and the surface of the base layer.

In Frame 5, the deposit of thick-film paste is dried, under conditions such as a temperature of about 50° C. to about 100° C. and a duration of about 1 to about 30 minutes, during which time the solvent in the thick-film paste dissolves and solubilizes the photoresist material, and induces the mixing of photoresist material with, or diffusion of photoresist material into, the layer of thick-film paste. The portion of the layer of thick-film paste into which photoresist material has diffused is thereby rendered insoluble to development with the same type of developer that will remove the portion of the thick-film paste that has had no contact with photoresist material.

In Frame 6, the layer of thick-film paste is then developed to remove the thick-film paste in all locations or areas where photoresist material has not contacted, mixed with, or diffused into the thick-film paste. This leaves in the final deposit not only the photoresist material that was not irradiated sufficiently to become soluble but also the thick-film paste into which photoresist material diffused and thus made similarly insoluble.

The electronic device is at this stage of the method useful as an intermediate in the fabrication of a device that requires the presence of fired thick-film paste. Another embodiment of this invention is thus an electronic device wherein there is a patterned deposited on a surface thereof of a mixture of a photoresist material and a thick film paste material. The pattern of deposit may be, for example, a deposit into an array of through holes in a layer in a stack. This intermediate, i.e. a stack containing in its through holes the dried and developed final insoluble deposit, which has been patterned by the selective irradiation and diffusion techniques described herein, may then be fired for example at 300 to 550° C. for 5 to 30 minutes in either air or an inert gas atmosphere. The organic constituents in the mixture of photoresist material and thick film paste are burned off in the firing step, leaving a sintered thick film paste.

WO 01/99146 describes a thick-film paste containing carbon nanotubes for use as an electron emitting material in an electron field emitter, and a method for improvement of field emission performance. The improvement method involves laminating on the surface of the emitter a film of polymer, and then stripping off the laminated film. Alternatively, a liquid elastomer precursor is used to coat the emitter followed by heat- or UV-induced polymerization of the precursor to form a film, and then removal of the film. This activation step is suitable for performance on emitters made from a thick-film paste according to the methods hereof. The methods hereof may thus further involve a step of applying to the external layer a material that is a precursor to a flexible film to provide on the external layer, and in the through holes, a layer of the precursor material, polymerizing or curing the precursor material to form the flexible film, and removing the flexible film.

The method of this invention is useful in achieving patterning of a thick-film paste in surface features such as through holes, where a thick-film paste by itself has only limited patterning resolution by screen or stencil printing. Photopatterning of a thick-film paste is often limited by the solids contents of the paste, which tends to reduce the optical transparency of the paste. Binder diffusion transfer patterning in surface features such as through holes provides a simple method of obtaining fine feature patterning of thick-film paste by separating the patterning method from the thick-film paste to a second photoresist layer. The method of this invention is thus particularly useful because it provides a low cost means of achieving precise deposition of thick-film paste at the junctions of the side walls of a through hole with the base layer without the use and alignment of an external photomask.

Additionally, potential device fabrication method and material cost reductions can be identified. No photomask and no mask alignment are required. No photosensitive ingredients are needed in the thick-film paste. No back imaging is required, hence the substrate need not be transparent. If desired, all solutions used in the methods hereof may be aqueous, and thus no organic solvents are required.

Where, for example, the base layer is conductive, where the thick-film paste contains an electron emitting material, and particularly where the external layer or one of the intermediate layers is conductive, field emission may be obtained from the stack when a voltage is applied to the base layer. Device performance and method advantages enabled by this invention in such instance are thus as follows: the method of this invention allows greater coverage by the emitting material, which improves current at a given driving voltage. The uniformity of emission from pixel to pixel of a field emission device, and emitter lifetime, may also be improved with greater emitter coverage. Since the emitter is located at the bottom of a through hole, the emitter/gate electrode distance may also be reduced. This can be used to reduce the driving voltage. Furthermore, the angle between the emitter and the gate electrode can be made closer to vertical. This reduces the electron divergence. The absence of emitter in the center of the through hole reduces diode and hot spot emission.

A layer stack prepared by a method hereof may be used, for example, as an electron field emitter, and may as such be used, in a further example, in a flat panel computer display, in a television and in other types of displays, and in vacuum electronic devices, emission gate amplifiers, klystrons and in lighting devices. They are particularly useful in large area flat panel displays, i.e. for displays greater than 30 inches (76 cm) in size. The flat panel displays can be planar or curved. These devices are more particularly described in US 2002/0074932, which is by this reference incorporated in its entirety as a part hereof for all purposes.

EXAMPLE

The advantageous attributes and effects of the apparatus, compositions and methods hereof may be seen in a practical example as described below. The embodiments of the subject matter hereof on which the example is based are representative only, and the selection of those embodiments to illustrate the invention does not indicate that materials, reactants, conditions, steps, techniques, or protocols not described in these examples are not suitable for practicing these processes, or that subject matter not described in these examples is excluded from the scope of the appended claims and equivalents thereof.

A novalac type photoresist AZ4330 obtained from Clariant Cooperation was spin coated on a device substrate comprising a glass substrate coated with a chromium base layer, a 15 μm thick dielectric middle layer, a chromium top layer, and holes of 50 μm diameter through to top and middle layers. A spinning speed of 1500 rpm and a spinning time of 45 sec was used. The AZ4330 film was dried on a 100° C. hot plate for 2 minutes. The photoresist film was found to be 4, 15, and 10 μm thick measured from the top chromium layer, side wall to hole bottom junction, and hole center regions respectively.

The photoresist was flood exposed to UV (350-450 nm) radiation with a exposure dose of about 200 mJ/cm$^2$. The substrate was developed in AZ300 MIF developer solution also obtained from Clariant for 4 minutes. FIG. 2 show a ring of photoresist remaining after such development at the hole side wall and bottom junctions. The photoresist film was completely removed from the substrate top surface as well as from center region of the hole bottom.

An alkaline developable thick film paste which contains binder polymers, oxide particles and carbon nanotubes was prepared using texanol as the paste solvent. A blanket film of the CNT paste was screen printed on the substrate overcoating the holes and residual photo-resist. A C350 mesh screen was used for printing. The CNT paste film was dried on a 100° C. hot plate for 5 minutes. The thickness of the dried CNT paste film was found to be 8 micron thick measured from the top chromium layer.

The dried CNT paste film was sprayed with 0.5% NaCO$_3$ aqueous solution for 60 seconds during which the CNT paste film was washed away from regions free of residual resist. A ring of CNT paste film remains after alkaline development at the junction of the hole side wall and bottom. FIG. 3 shows the CNT paste deposit, which has an expanded dimension compared to the photoresist deposit shown in FIG. 2.

Where a range of numerical values is recited herein, the range includes the endpoints thereof and all the individual integers and fractions within the range, and also includes each of the narrower ranges therein formed by all the various possible combinations of those endpoints and internal integers and fractions to form subgroups of the larger group of values within the stated range to the same extent as if each of those narrower ranges was explicitly recited. Where a range of numerical values is stated herein as being greater than a stated value, the range is nevertheless finite and is bounded on its upper end by a value that is operable within the context of the invention as described herein. Where a range of numerical values is stated herein as being less than a stated value, the range is nevertheless bounded on its lower end by a non-zero value.

In this specification, unless explicitly stated otherwise or indicated to the contrary by the context of usage, (a) amounts, sizes, ranges, formulations, parameters, and other quantities and characteristics recited herein, particularly when modified by the term "about", may but need not be exact, and may also be approximate and/or larger or smaller (as desired) than stated, reflecting tolerances, conversion factors, rounding off, measurement error and the like, as well as the inclusion within a stated value of those values outside it that have, within the context of this invention, functional and/or operable equivalence to the stated value;

(b) use of the indefinite article "a" or "an" with respect to a statement or description of the presence of an element or feature of this invention, does not limit the presence of the element or feature to one in number;

(c) where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the subject matter hereof, however, may be stated or described as consisting essentially of certain features or elements, in which embodiment features or elements that would materially alter the principle of operation or the distinguishing characteristics of the embodiment are not present therein. A further alternative embodiment of the subject matter hereof may be stated or described as consisting of certain features or elements, in which embodiment, or in insubstantial variations thereof, only the features or elements specifically stated or described are present.

What is claimed is:

1. A method of depositing a thick-film paste in a through hole having a side wall, comprising (a) providing a stack of layers that comprises a base layer and an external layer disposed on the surface of the base layer, or on the surface of one or more intermediate layers that reside between the external layer and the base layer, wherein the stack of layers has a top and the external layer is on the top of the stack of layers and comprises a plurality of through holes that pass through the external layer and any intermediate layers to expose the surface of the base layer;

(b) providing a photoresist material;

(c) coating with the photoresist material to thereby provide a layer of the photoresist material across the surface of the external layer and a layer of the photoresist material in each through hole and onto the surface of the base layer, wherein the thickness of the layer of the photoresist material coated in each through hole and onto the surface of the base layer is greater than the thickness of the layer of the photoresist material deposited on the surface of the external layer;

(d) solidifying the photoresist material, with the result that the thickness of the layer of the solidified photoresist material coated in the through holes is greater than the thickness of the layer of the solidified photoresist material on the surface of the external layer;

(e) flood irradiating, from the top of the stack of layers, the photoresist material to convert to a soluble form (i) the solidified photoresist material on the external layer, and (ii) the solidified photoresist material down to a selected depth of the solidified photoresist material in the through holes;

(f) developing the photoresist material and removing the solidified photoresist material (1) from the external layer, and (2) from within the through holes down to the selected depth, wherein removal of photoresist material from within the through holes removes photoresist material from an interior portion of a circumscribed area of the surface of the base layer thereby exposing the surface of the base layer and leaving photoresist material remaining at the junction of the side wall of each through hole with the surface of the base layer;

(g) providing a thick-film paste comprising a solvent;

(h) coating with the thick-film paste to provide thereby a layer of the thick-film paste across the external layer and in the through holes, wherein the thick-film paste has contacted the photoresist material at the junction of the side wall of each through hole and the surface of the base layer;

(i) solubilizing the photoresist material with the solvent in the locations in the through holes at which the thick-film paste contacts the photoresist material; and (j) developing the thick-film paste to remove it from all locations except those in which the thick-film paste has contacted the photoresist material.

2. A method according to claim 1 wherein the stack of layers comprises one or more intermediate layers that reside between the base layer and the external layer, and the through holes pass through the intermediate layers to expose the surface of the base layer.

3. A method according to claim 2 wherein at least one intermediate layer is conductive.

4. A method according to claim 2 wherein at least one intermediate layer is a dielectric.

5. A method according to claim 1 wherein the stack of layers comprises a substrate on the side of the base layer that is opposite from the external layer.

6. A method according to claim 1 wherein the thick-film paste comprises an electron emitting material.

7. A method according to claim 6 wherein the electron emitting material comprises carbon nanotubes.

8. A method according to claim 1 further comprising a step of coating the external layer with a material that is a precursor to a flexible film to provide on the external layer and in the holes a layer of the precursor material, polymerizing or curing the precursor material to form the flexible film, and removing the flexible film.

9. A method according to claim 1 wherein the photoresist material is selected from the group consisting of phenolic resins, DNQ/Novalac resists, acrylic polymers, polymers with pendent t-butyl groups, polystyrene, and ethyl cellulose.

10. A method according to claim 1 further comprising installing the stack of layers in an electronic device.

\* \* \* \* \*